United States Patent [19]
Hogge, Jr. et al.

[11] Patent Number: 5,596,804
[45] Date of Patent: Jan. 28, 1997

[54] METHOD OF CONSTRUCTING AN ELECTROMAGNETICALLY SHIELDED MICROSTRIP CIRCUIT

[75] Inventors: Charles R. Hogge, Jr.; Pankaj H. Bhatt, both of Plano, Tex.

[73] Assignee: Alcatel Network Systems, Inc., Richardson, Tex.

[21] Appl. No.: 429,893

[22] Filed: Apr. 27, 1995

Related U.S. Application Data

[62] Division of Ser. No. 16,960, Feb. 12, 1993, Pat. No. 5,436,405.

[51] Int. Cl.$^6$ .......................................... H05K 3/34
[52] U.S. Cl. .................. 29/840; 29/739; 29/843; 228/180.21; 333/238; 333/247
[58] Field of Search .......................... 29/739, 741, 840, 29/843, 846, 850; 174/250, 253; 228/180.21; 331/177 V; 333/128, 238, 246, 247; 361/816

[56] References Cited

U.S. PATENT DOCUMENTS

| | | | |
|---|---|---|---|
| 3,982,271 | 9/1976 | Olivieri et al. | 333/238 X |
| 4,310,809 | 1/1982 | Buck et al. | 331/177 Y X |
| 4,617,729 | 10/1986 | Celnik | 29/840 |
| 4,733,462 | 3/1988 | Kawatani | 29/840 |
| 5,294,751 | 3/1994 | Kamada | 174/52.4 |
| 5,297,007 | 3/1994 | Deyo et al. | 361/707 |
| 5,298,684 | 3/1994 | Leeb | 174/250 |

FOREIGN PATENT DOCUMENTS

| | | | |
|---|---|---|---|
| 464283 | 2/1992 | Japan | 29/739 |
| 464285 | 2/1992 | Japan | 29/739 |

*Primary Examiner*—Peter Vo
*Attorney, Agent, or Firm*—Vinson & Elkins L.L.P.

[57] ABSTRACT

A method of constructing a circuit for communicating electrical signals and assembled at least in part by an automated assembly machine is disclosed. The automated assembly machine is operable to select from a plurality of components. The circuit includes a material having a first and second surface and a length. A strip conductor is positioned along the first surface of the material. A ground structure is disposed along the length of the second surface. Finally, a low impedance device selected from the plurality of components is electrically coupled to the ground structure on opposite sides of the strip conductor, wherein the coupling of the low impedance device to the ground structure forms a circumferential shield around the strip conductor. Various alternative embodiments, as well as fabrication methodology are also disclosed.

16 Claims, 2 Drawing Sheets

5,596,804

METHOD OF CONSTRUCTING AN ELECTROMAGNETICALLY SHIELDED MICROSTRIP CIRCUIT

RELATED APPLICATIONS

This application is a Divisional of application Ser. No. 08/016,960, filed Feb. 12, 1993, and entitled "Electromagnetically Shielded Microstrip Circuit and Method of Fabrication" now U.S. Pat. No. 5,436,405.

This invention relates in general to microstrip technology, and more particularly to an electromagnetically shielded microstrip circuit and method of its fabrication.

BACKGROUND OF THE INVENTION

Microstrip technology in general is well known in the art. Microstrip lines are generally perceived as a form of transmission line. They typically provide a useful means of signal transmission for short-distance applications. Moreover, microstrip configurations are commonly utilized as a basic building block in hybrid microwave microcircuits. The transmission line optimally provides matched interconnections between signal sources and loads.

FIG. 1 illustrates a perspective view of a typical prior art microstrip configuration designated generally at 10. Configuration 10 is typically a planar structure including a substrate 12. Substrate 12 may be of any known dielectric material such as alumina or polyamide. The height of substrate 12 varies, and may be on the order of 0.010 to 0.062 inches. Both the thickness and type of material of substrate 12 are commonly chosen based on other circuit components (not shown) which it may support, as well as the material thermal conductivity, surface finish, dielectric constant, thermal coefficient of expansion and ability to withstand processing temperatures.

Substrate 12 supports a microstrip conductor 14 which is formed by known techniques. For example, microstrip conductor 14 may be deposited by thin-film techniques using deposition in a vacuum by electron-beam evaporation or sputtering. Microstrip conductor 14 is commonly on the order of 0.010 to 0.125 inches in width and 0.0010 to 0.0023 inches in height. The length of microstrip conductor 14 is established to accommodate the location of the source and destination (not shown) for the signal transmitted by the conductor. A ground plane 16 is deposited along a second surface of substrate 12. Ground plane 16 is a suitable width relative to that of conductor 14 such that it approximates an infinite plane.

It should be noted that FIG. 1 illustrates configuration 10 standing alone only by way of example. Typically, such a configuration is included in a much larger structure, such as a board to be used in the assembly of a contemporary computer system (e.g., a motherboard). Such a board may be fabricated to include a portion having a dielectric layer that separates a ground plane from a microstrip conductor. In systems applications, these boards often implement, or are exposed to, potentially strong electromagnetic signals. For example, the microstrip conductor may itself transmit high frequency signals. Thus, a need arises to prevent these signals from interfering with other circuitry in close proximity to the microstrip conductor. Conversely, the circuitry proximate the microstrip conductor may also involve high levels of electromagnetic interference. Naturally, it is likewise desirable to shield the microstrip conductor from potential interference created by such other circuitry.

It is therefore an object of the present invention to provide an electromagnetically shielded microstrip circuit and a method of fabricating such a circuit.

It is a further object of the present invention to provide such a circuit having minimum refections or distortions of the electric field surrounding the microstrip conductor.

It is a further object of the present invention to provide such a circuit assembled at least in part by an automated assembly machine operable to select from a plurality of components.

It is a further object of the present invention to provide such a circuit having a low impedance device selected from automated assembly machine components, wherein the combination of the low impedance device coupled to the ground plane forms a circumferential shield around the strip conductor.

Still other objects and advantages of the present invention will become apparent to those of ordinary skill in the art having reference to the following specification together with its drawings.

SUMMARY OF THE INVENTION

In one embodiment, the present invention includes a circuit for communicating electrical signals and assembled at least in part by an automated assembly machine operable to select from a plurality of components. The circuit includes a material having a first and second surface and a length. A strip conductor is positioned along the first surface and has a first and second side. A ground structure is positioned along the length of the second surface of the material. A low impedance device selected from the plurality of components is electrically coupled to the ground structure on opposite sides of the strip conductor. Accordingly, the combination of the low impedance device coupled to the ground structure forms a circumferential shield around the strip conductor.

In another embodiment, the present invention includes a method of constructing a circuit for communicating electrical signals. Under the method, a strip conductor is formed having a first and second side along a substrate. A ground plane is also formed along the substrate and separated from the strip conductor by an insulating material. In addition, an automated assembly machine is operated to select a low impedance device from a plurality of components and to place the low impedance device in electrical contact with the ground plane, thereby forming a circumferential shield around the strip conductor.

BRIEF DESCRIPTION OF THE DRAWINGS

For a more complete understanding of the present invention and its advantages, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1–4 of the drawings, like numerals being used for like and corresponding parts of the various drawings.

Figure 1:
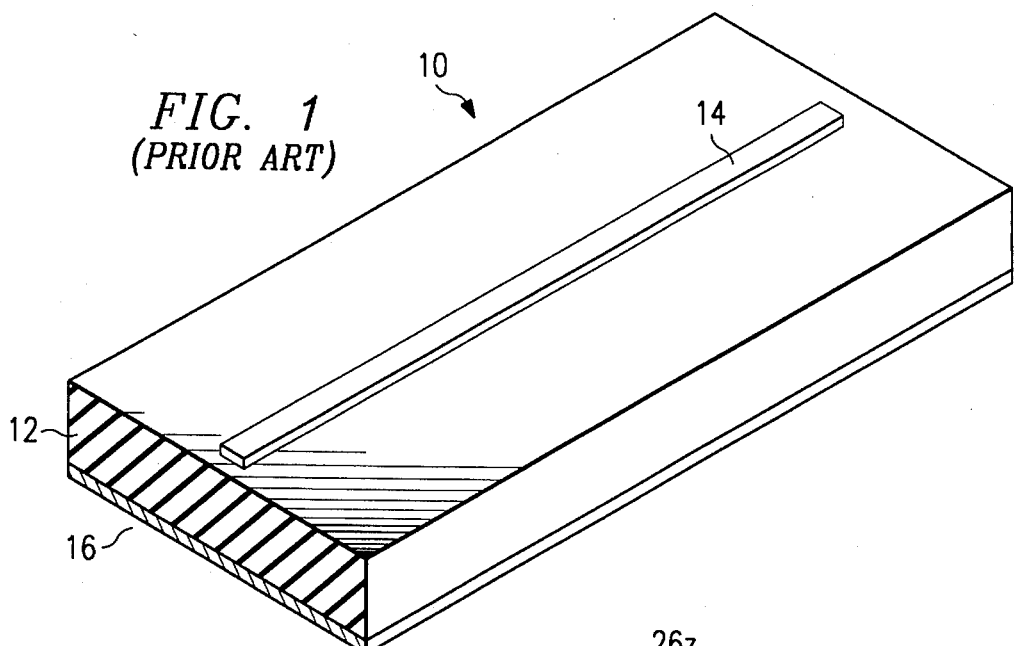
FIG. 1 illustrates a perspective view of a typical prior art microstrip configuration.
Figure 2:
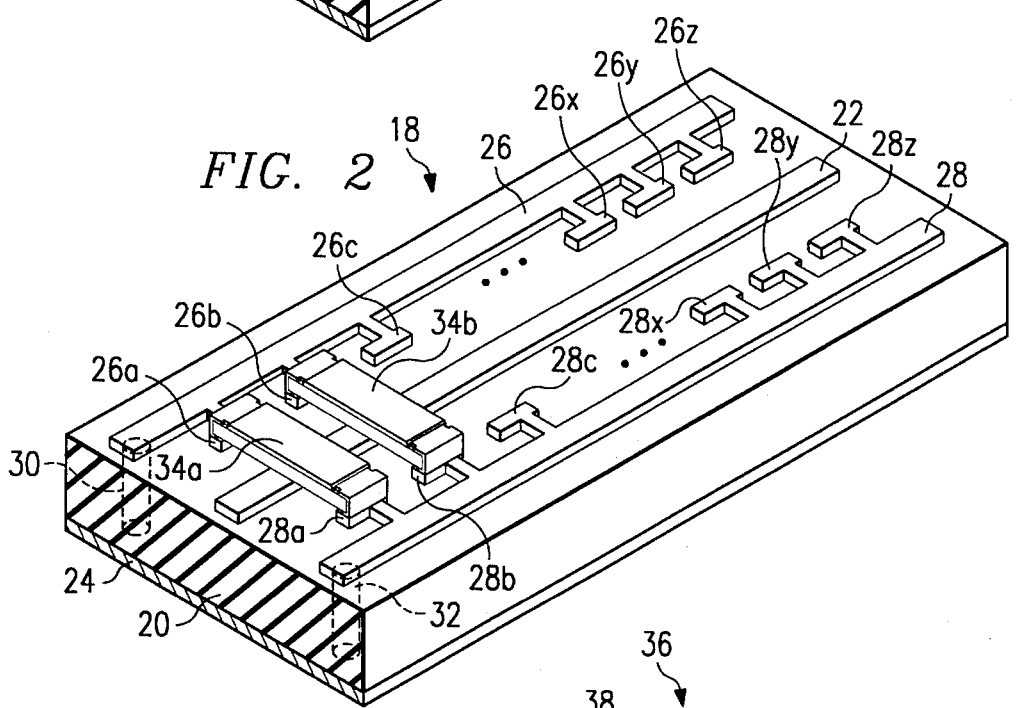
FIG. 2 illustrates a perspective view of a microstrip configuration having two low impedance devices shielding the microstrip conductor in accordance with the present invention.

FIG. 2 illustrates a perspective view of a microstrip configuration in accordance with the present invention and designated generally at 18. In addition to aspects discussed below, microstrip configuration 18 also includes the same components as configuration 10 of FIG. 1. Thus, without restating the detail set forth above, configuration 18 includes a substrate 20 supporting a microstrip conductor 22 and a ground plane 24.

Substrate 20 also supports individual strip ground conductors 26 and 28 along each side of, and substantially parallel to, microstrip conductor 22. Ground conductors 26 and 28 typically have the same dimensions as microstrip conductor 22. Moreover, a distance on the order of 0.010 to 0.125 inches exists between each side of microstrip conductor 22 and the respective ground conductor 26 and 28.

Each of ground conductors 26 and 28 includes a series of conductive contact pads. For purposes of illustration, these contact pads are labeled in sequence using sequential alphabetic characters in combination with the associated ground conductor. Thus, contact pads 26a through 26z are connected to ground conductor 26, while contact pads 28a through 28z are connected to ground conductor 28. The specific number of contact pads, as well as the spacing between successive contact pads, may be chosen by a person skilled in the art according to the principles taught herein. Moreover, as readily apparent below, each of the contact pads provides an electrical contact for connecting a device in electrical communication with a corresponding ground conductor. Thus, alternative shapes and sizes which also provide this function may be substituted by a person having skill in the art. In the preferred embodiment, however, each of the contact pads is formed concurrently with the formation of the corresponding ground conductor. Each contact pad is preferably rectangular in shape having dimensions on the order of 0.040 by 0.060 inches. Moreover, each rectangular pad is connected to the corresponding ground conductor by a conductive extension on the order 0.020 inches in width and 0.025 inches in length.

It should also be noted that ground conductors 26 and 28 are in electrical contact with ground plane 24 through couplers 30 and 32, respectively. In FIG. 2, couplers 30 and 32 are shown in phantom. Such an illustration represents that there are actually a series of couplers spaced at periodic distances beneath strip ground conductors 26 and 28. Moreover, in the preferred embodiment, there is one-to-one correspondence for each contact pad 26a through 26z, and 28a through 28z, and a coupler connecting it to ground plane 24. Couplers 30 and 32 (as well as the other couplers which are not visible) are formed using known fabrication techniques. For example, a cylindrical hole may be formed through the respective strip ground conductor, substrate 20 and ground plane 24. Typically, the hole is on the order of 0.012 inches in diameter. Thereafter, a conductive material is formed along the circumference of the hole, thereby providing a tubular conductive path between the respective strip ground conductor and ground plane 24. It should be noted that alternative couplers and/or methods of fabrication could be chosen by a person skilled in the art. For example, rivets, or alternative conductive structures, could be used to provide an electrical contact from ground plane 24 to the upper surface of substrate 20.

Configuration 18 also includes a low impedance device 34a connected between contact pads 26a and 28a. In the preferred embodiment, low impedance device 34a is a component which is compatible with an automated assembly machine as described below. Moreover, low impedance device 34a preferably has a resistance less than 0.05 Ohms. Under the present invention, the addition of low impedance device 34a causes a complete circumferential enclosure around microstrip conductor 22. Specifically, as appreciated from FIG. 2, such an enclosure is created by the combination of low impedance device 34a, couplers 30 and 32, and ground plane 24. It should also be noted that because of the low impedance of device 34a (e.g., less than 0.05 Ohms), the amount of voltage across it is minimal. Thus, low impedance device 34a approximates a ground potential overlying microstrip 22. Consequently, this ground, along with the ground potential around the other bounding devices (i.e., ground plane 24 and couplers 30 and 32), provides a shielding effect around microstrip conductor 22. Thus, any field created by a signal passing through microstrip conductor 22 is shielded in the vicinity of low impedance device 34a. Moreover, any field created by devices proximate low impedance device 34a is shielded from microstrip conductor 22.

It should also be noted that it is preferable to maximize the distance between the top surface of microstrip conductor 22 and the resistive element of low impedance device 34a (while maintaining the least possible impedance). In the preferred embodiment, this space is on the order of 0.010 to 0.030 inches. By increasing this distance, interference to microstrip conductor 22 caused by low impedance device 34a is minimized.

In view of the above, it is believed that a device having a low impedance other than a low-value resistor may also prove beneficial in accordance with the present invention. For example, as known in the art, the impedance of a capacitor decreases with increased capacitance. Thus, one skilled in the art may identify a large value capacitor with adequate physical configuration to also perform satisfactorily under the present invention.

FIG. 2 further illustrates an additional low impedance device 34b connected between contact pads 26b and 28b. Low impedance device 34b is preferably the same type of device as low impedance device 34a. Low impedance device 34b is affixed to configuration 18 at a predetermined spacing from low impedance device 34a. In the preferred embodiment, this spacing is less than or equal to one-eighth of the wavelength of the signal to be shielded. Thus, if the signal carried by microstrip conductor 22 has a shorter wavelength than any other proximate signal, then the spacing between the low impedance devices is determined based on this wavelength. Alternatively, if a potentially interfering signal generated proximate microstrip conductor 22 has a shorter wavelength, then that shorter wavelength is preferably used to determine the spacing between the low impedance devices. As discussed in connection with FIG. 3, below, it should also be noted that a number of additional low resistance impedance devices could be connected in the same manner as devices 34a and 34b, thereby providing an extended shielding effect along the length of microstrip conductor 22.

In the preferred embodiment, configuration 18 is included in a structure, such as a computer board, which supports circuitry assembled at least in part by an automated assembly machine. As known in the art, such machines are operable to quickly select from a plurality of machine-compatible components, and place the selected component on a circuit board or the like. Because of these advantages, low impedance devices 34a and 34b (as well as additional ones if used) are preferably components which are compatible with such an automated assembly machine. As a result, such a machine may perform placement of low impedance devices 34a and 34b very quickly and with accurate precision on the board.

As an example, one popular automated assembly machine is a surface mount technology ("SMT") machine known in the art. As known in the SMT art, a solder paste is deposited where subsequent electrical components are to be affixed to a board. Thereafter, the SMT machine selects a single component from an array of assembly-compatible components. For example, components attached to reels of adhesive are often accessible to the SMT machine. The machine removes the selected component from its respective reel, and places it on the circuit board. The SMT machine can approach component placement times on the order of 25000 parts per hour, and with tolerances on the order of 0.006 inch. Thus, in accordance with the above, one skilled in the art may readily appreciate that a number of low impedance resistors may be affixed in place with precise accuracy and in an extremely quick fashion. After the component (as well as other components) is so placed, the board is subjected to a heating process which causes the solder paste to flow and adhere the components in place.

Figure 2A:
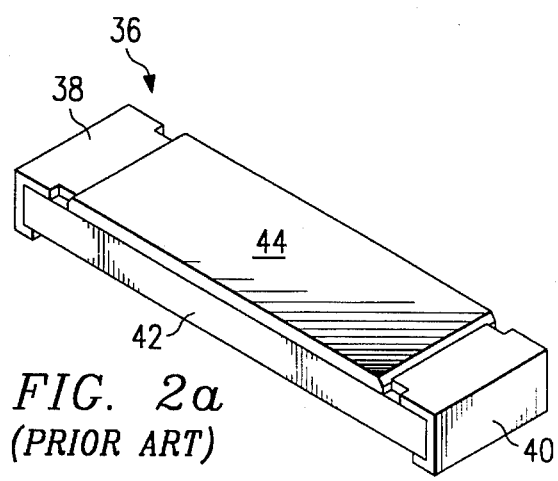
FIG. 2a illustrates an enlarged and detailed view of a preferable low impedance device utilized in accordance with the present invention.

When using an SMT machine, low impedance devices 34a and 34b are preferably so-called "zero ohm resistors". FIG. 2a illustrates a perspective view of such a device designated generally at 36. Device 36 is known in the art, and may be obtained as part number RM73B2BT000J from KOA SPEER located in Bradford, Pa. Device 36 is typically on the order of 0.126 inches in length, 0.063 inches in width and 0.022 inches in height. Device 36 has conductive terminations 38 and 40 at its opposing ends. Terminations 38 and 40 are separated by an insulating substrate 42, typically made of alumina. Substrate 42 further supports a resistive element 44 encased in a protective coating (not specifically designated). Thus, returning to FIG. 2, it may be appreciated that the structure of low impedance device 34a (and 34b), including its cantilever-shaped terminations and its insulating substrate, provides for a fixed distance between the top surface of microstrip conductor 22 and the resistive element at the top of each low impedance device. As stated above, this distance reduces any effect the device could have on the electric field associated with microstrip conductor 22.

Figure 3:
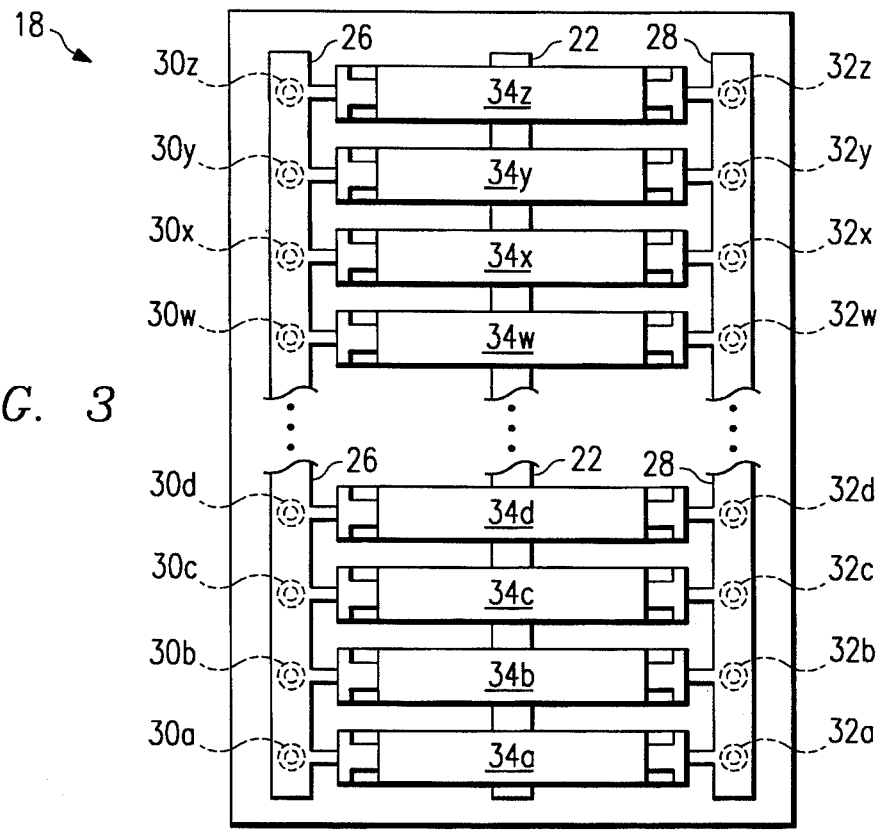
FIG. 3 illustrates a top view of a microstrip configuration having a plurality of low impedance devices and strip ground conductors shielding the microstrip conductor in accordance with the present invention.

FIG. 3 further illustrates the concept discussed above in connection with FIG. 2. Specifically, FIG. 3 illustrates a top view of microstrip configuration 18 of FIG. 2 with a plurality of low impedance devices 34a through 34z. The use of designations "a" through "z" is intended to illustrate that any number of low impedance devices may be included in accordance with the present invention. Moreover, as appreciated from the perspective of FIG. 3, the placement of low impedance devices 34a through 34z in a side-by-side manner can approximate an almost continuous shield over microstrip conductor 22. Indeed, as automated assembly machine technology advances, such placement may permit devices 34a through 34z to align in contact with one another.

Thus, such advantages may further the overall shielding effect of the devices. Note also that FIG. 3 illustrates, in phantom, couplers 30a through 30z, and 32a through 32z. As stated in connection with FIG. 2, these couplers provide a connection between their respective ground strip conductor and the underlying ground plane. Moreover, as stated for the preferred embodiment, one coupler is provided for each respective conductive contact pad.

Figure 4:
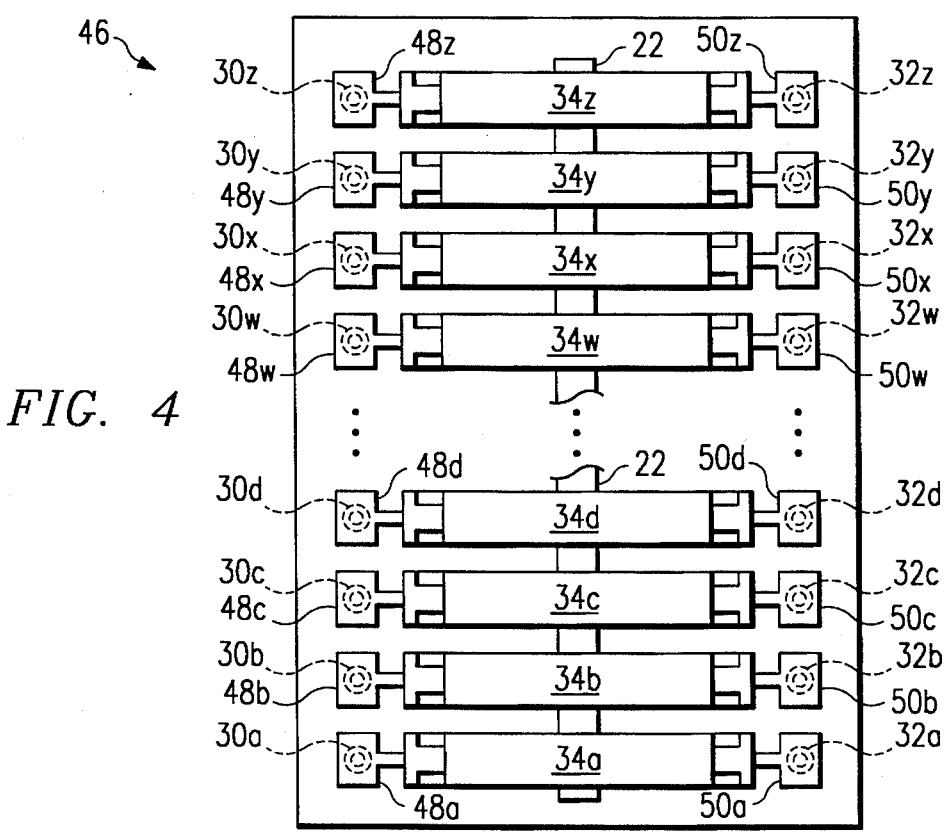
FIG. 4 illustrates a top view of an alternative microstrip configuration having a plurality of low impedance devices coupled by respective couplers to a ground plane, thereby shielding the microstrip conductor in accordance with the present invention.

FIG. 4 illustrates a top view of an alternative configuration designated generally at 46. Configuration 46 is similar to configuration 18 of FIG. 3 in that both include a number of side-by-side low impedance devices 42a through 42z shielding an underlying microstrip conductor 22. The embodiment of FIG. 4, however, eliminates ground conductors 26 and 28 shown in FIGS. 2 and 3. Again, the ending terminations of each low impedance device overlie respective conductive contact pads (not visible in the perspective of FIG. 4). Rather than connecting to strip ground conductors, however, each underlying contact pad is connected to a corresponding coupler pad designated 48a through 48z along one side of configuration 46, and 50a through 50z along the other. Coupler pads 48a through 48z make electrical contact to underlying couplers 30a through 30z, and coupler pads 50a through 50z make similar electrical contact to underlying couplers 32a through 32z. Thus, according to configuration 46, each low impedance device, in combination with its contact pads, coupler pads and the ground plane, provides a shield around microstrip conductor 22 in accordance with the present invention. These shields, however, are not joined by strip ground conductors as shown in FIGS. 2 and 3. Note further that a person skilled in the art could provide alternative couplers and contacts for connecting a low impedance device in a circumferential fashion around a microstrip conductor as taught by the inventive concepts discussed herein.

From the above, it may be appreciated that the present invention provides an enhanced electromagnetically shielded microstrip circuit and method of fabrication. Moreover, the embodiments and advantages discussed herein demonstrate that, while the present invention has been described in detail, various substitutions, modifications or alterations could be made to it by a person skilled in the art. For example, while an SMT machine was discussed as the preferable mode of automated assembly, the present invention is also workable with known "through-hole" technology. In this technology, a semiconductor package having low impedance values between opposing pins could be constructed to overlie a microstrip conductor, thereby providing many of the benefits described above. Other examples of variations of the present invention have been set forth above. In addition, various exemplary dimensions are set forth herein which could be altered by a person having skill in the art. Thus, each of these alternatives, as well as others readily apparent to one skilled in the art, are intended within the inventive scope as defined by the following claims.

What is claimed is:

1. A method of constructing an electromagnetically shielded strip conductor in a circuit for communicating electrical signals, comprising:

forming a strip conductor having a first and second side along a first surface of a substrate;

forming a ground plane along a second surface of said substrate and separated from said strip conductor by an insulating material;

operating an automated assembly machine to select a low impedance device from a plurality of components;

operating said automated assembly machine to place said low impedance device in electrical contact with said ground plane, wherein a combination of said ground plane and said low impedance device forms a circumferential shield around said strip conductor;

forming a first ground conductor along said substrate and adjacent said first side of said strip conductor;

forming a second ground conductor along said substrate and adjacent said second side of said strip conductor;

wherein said step of forming a first ground conductor along said substrate comprises forming a first plurality of contact pads in electrical communication with said first ground conductor and adjacent said first side of said strip conductor; and wherein said step of forming a second ground conductor along said substrate comprises forming a second plurality of contact pads in electrical communication with said second ground conductor and adjacent said second side of said strip conductor.

2. The method of claim 1 and further comprising the steps of:

displacing a solder paste at a point in electrical communication with said electrical contact with said ground plane; and heating said solder paste after said step of operating said automated assembly machine to place said low impedance device such that said solder paste flows and electrically connects said low impedance device to said ground plane.

3. The method of claim 1 wherein said step of operating said automated assembly machine to place said low impedance device comprises operating said automated assembly machine to place a zero ohm resistor.

4. The method of claim 1 wherein said first ground conductor and said first plurality of contact pads are formed concurrently, and wherein said second ground conductor and said second plurality of contact pads are formed concurrently.

5. The method of claim 1 wherein said step of operating said automated assembly machine to place said low impedance device comprises operating said automated assembly machine to place said low impedance device in electrical contact between a contact pad of said first plurality of contact pads and a contact pad of said second plurality of contact pads.

6. The method of claim 1 wherein said strip conductor has an upper surface opposite said substrate, and wherein said step of operating said automated assembly machine to place said low impedance device comprises placing said low impedance device to minimize a distance between said upper surface and said low impedance device to less than 0.030 inches.

7. The method of claim 1 wherein said first ground conductor and said first plurality of contact pads are formed concurrently, and wherein said second ground conductor and said second plurality of contact pads are formed concurrently.

8. The method of claim 1 wherein said step of operating said automated assembly machine to place said low impedance device comprises operating said automatic assembly machine to place said low impedance device in electrical contact between a contact pad of said first plurality of contact pads and a contact pad of said second plurality of contact pads.

9. A method of operating an automated assembly machine to construct a circumferential shield around a strip conductor along a substrate having a first and second ground contact along a first surface of said substrate and on opposing sides of said strip conductor, and a ground plane along a length of a second surface of said substrate, comprising the steps of:

selecting a low impedance device from a plurality of components selectable by said automated assembly machine;

placing said low impedance device in electrical contact with said first and second ground conductors and overlying said strip conductor, wherein a combination of said low impedance device in electrical contact with said first and second ground conductors and said ground plane form a circumferential shield around said strip conductor; and wherein said low impedance device comprises a first low impedance device, and further comprising an additional plurality of low impedance devices, wherein each of said plurality of low impedance devices is selected from said plurality of components and electrically contacted to said first and second ground conductors, wherein each combination of said low impedance device coupled to said first and second ground conductors and said ground plane forms a circumferential shield around said strip conductor.

10. A method of operating an automated assembly machine to construct a circumferential shield around a microstrip transmission line affixed to a top surface of a substrate and having a ground plane juxtaposed below said microstrip transmission line along a bottom surface of said substrate, comprising the steps of:

forming a first ground conductor along said substrate and adjacent said first side of said strip conductor, wherein said step of forming a first ground conductor along said substrate comprises forming a first plurality of contact pads in electrical communication with said first ground conductor and adjacent said first side of said strip conductor;

forming a second ground conductor along said substrate and adjacent said second side of said strip conductor, wherein said step of forming a second ground conductor along said substrate comprises forming a second plurality of contact pads in electrical communication with said second ground conductor and adjacent said second side of said strip conductor;

arranging a series of automatic machine assembly components of a low impedance value connected side by side from respective ones of said first plurality of contact pads to respective ones of said second plurality of contact pads along a length of said microstrip transmission line requiring electronic shielding; and wherein the combination of said ground plane, said series of automatic machine assembly components of a low impedance value, and said first and second ground conductors form a circumferential shield for said microstrip transmission line.

11. A method of constructing an electromagnetically shielded strip conductor in a circuit for communicating electrical signals, comprising:

forming a strip conductor having a first and second side along a first surface of a substrate;

forming a ground plane along a second surface of said substrate and separated from said strip conductor by an insulating material;

operating an automated assembly machine to select a first low impedance device from a plurality of components;

operating said automated assembly machine to place said first low impedance device in electrical contact with said ground plane, wherein a combination of said ground plane and said first low impedance device forms a circumferential shield around said strip conductor; and operating said automated assembly machine to select a second low impedance device from said plurality of components; and operating said automated assembly machine to place said second low impedance device in electrical contact with said ground plane, wherein a combination of said ground plane and said second low impedance device forms a circumferential shield around said strip conductor; and wherein said strip conductor is to be shielded in relation to a signal having a frequency of a predetermined wavelength, and wherein said second low impedance device is placed a predetermined distance from said first low impedance device, and wherein said predetermined distance is less than or equal to one-eighth of said wavelength.

12. The method of claim 11 wherein said first and second low impedance devices are a same type of device.

13. The method of claim 11 wherein said first and second low impedance devices comprise resistors having a resistance less than 0.05 ohms.

14. A method of constructing an electromagnetically shielded strip conductor in a circuit for communicating electrical signals, comprising:

forming a strip conductor having a first and second side along a first surface of a substrate, wherein said strip conductor has an upper surface opposite said substrate;

forming a ground plane along a second surface of said substrate and separated from said strip conductor by an insulating material;

operating an automated assembly machine to select a first low impedance device from a plurality of components;

operating said automated assembly machine to place said first low impedance device in electrical contact with said ground plane, wherein a combination of said ground plane and said first low impedance device forms a circumferential shield around said strip conductor and wherein said step of operating said automated assembly machine to place said first low impedance device comprises placing said first low impedance device to minimize a distance between said upper surface and said first low impedance device to less than 0.030 inches;

forming a first and second electrical contact providing electrical contact to said ground plane and positioned on opposite ones of said sides of said strip conductor, and wherein said step of operating said automated assembly machine to place said first low impedance device in electrical contact with said ground plane comprises placing said first low impedance device in electrical contact with said first and second electrical contacts;

operating said automated assembly machine to select a second low impedance device from said plurality of components; and operating said automated assembly machine to place said second low impedance device in electrical contact with said ground plane, thereby forming a circumferential shield around said strip conductor, wherein said strip conductor is to be shielded in relation to a signal having a frequency of a predetermined wavelength, and wherein said second low impedance device is placed a predetermined distance from said first low impedance device, and wherein said predetermined distance is less than or equal to one-eighth of said wavelength.

15. The method of claim 14 wherein said first electrical contact includes a first plurality of contact pads in electrical communication with said ground plane, and wherein said second electrical contact comprises a second plurality of contact pads in electrical communication with said ground plane.

16. The method of claim 15 wherein said step of placing said first low impedance device in electrical contact with said first and second electrical contacts comprises operating said automatic assembly machine to place said first low impedance device in electrical contact between a contact pad of said first plurality of contact pads and a contact pad of said second plurality of contact pads.

* * * * *